(12) United States Patent
Amblard et al.

(10) Patent No.: US 7,159,205 B1
(45) Date of Patent: Jan. 2, 2007

(54) USE OF NON-LITHOGRAPHIC SHRINK TECHNIQUES FOR FABRICATION/MAKING OF IMPRINTS MASKS

(75) Inventors: Gilles Amblard, San Jose, CA (US); Bhanwar Singh, Morgan Hill, CA (US); Khoi A. Phan, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 312 days.

(21) Appl. No.: 10/838,830

(22) Filed: May 4, 2004

(51) Int. Cl.
*G06F 17/50* (2006.01)
(52) U.S. Cl. .......................................... 716/19; 716/21
(58) Field of Classification Search ............. 716/19–21
See application file for complete search history.

(56) References Cited

U.S. PATENT DOCUMENTS 6,516,528 B1 * 2/2003 Choo et al. .................. 33/552

* cited by examiner

*Primary Examiner*—Paul Dinh
(74) *Attorney, Agent, or Firm*—Amin, Turocy, & Calvin, LLP (57) ABSTRACT

The present invention relates generally to photolithographic systems and methods, and more particularly to systems and methodologies that facilitate improved critical dimension (CD) control and the reduction of line-edge roughness (LER) during pattern line formation in an imprint mask. One aspect of the invention provides for forming features having CDs that are larger than ultimately desired in a mask resist. Upon application of a non-lithographic shrink technique, LER is mitigated and CD is reduced to within a desired target tolerance.

6 Claims, 12 Drawing Sheets

(CROSS-SECTION)

FIG. 5

(TOP-DOWN)

FIG. 6

(CROSS-SECTION)

(TOP-DOWN)

USE OF NON-LITHOGRAPHIC SHRINK TECHNIQUES FOR FABRICATION/MAKING OF IMPRINTS MASKS

TECHNICAL FIELD

The present invention relates generally to photolithographic systems and methods, and more particularly to systems and methodologies that mitigate line edge roughness and improve critical dimension control of imprint mask features.

BACKGROUND OF THE INVENTION

As semiconductor trends continue toward decreased size and increased packaging density, every aspect of semiconductor fabrication processes is scrutinized in an attempt to maximize efficiency in semiconductor fabrication and throughput. Many factors contribute to fabrication of a semiconductor. For example, at least one photolithographic process can be used during fabrication of a semiconductor. This particular factor in the fabrication process is highly scrutinized by the semiconductor industry in order to improve packaging density and precision in semiconductor structure.

Lithography is a process in semiconductor fabrication that generally relates to transfer of patterns between media. More specifically, lithography refers to transfer of patterns onto a thin film that has been deposited onto a substrate. The transferred patterns then act as a blueprint for desired circuit components. Typically, various patterns are transferred to a photoresist (e.g., radiation-sensitive film), which is the thin film that overlies the substrate during an imaging process described as "exposure" of the photoresist layer. During exposure, the photoresist is subjected to an illumination source (e.g. UV-light, electron beam, X-ray), which passes through a pattern template, or reticle, to print the desired pattern in the photoresist. Upon exposure to the illumination source, radiation-sensitive qualities of the photoresist permit a chemical transformation in exposed areas of the photoresist, which in turn alters the solubility of the photoresist in exposed areas relative to that of unexposed areas. When a particular solvent developer is applied, exposed areas of the photoresist are dissolved and removed, resulting in a three-dimensional pattern in the photoresist layer. This pattern is at least a portion of the semiconductor device that contributes to final function and structure of the device, or wafer.

Techniques, equipment and monitoring systems have concentrated on preventing and/or decreasing defect occurrence within lithography processes. For example, aspects of resist processes that are typically monitored can comprise: whether the correct mask has been used; whether resist film qualities are acceptable (e.g., whether resist is free from contamination, scratches, bubbles, striations, . . . ); whether image quality is adequate (e.g., good edge definition, line-width uniformity, and/or indications of bridging); whether critical dimensions are within specified tolerances; whether defect types and densities are recorded; and/or whether registration is within specified limits; etc. Such defect inspection task(s) have progressed into automated system(s) based on both automatic image processing and electrical signal processing.

Imprint lithography uses a patterned mask to "imprint" a pattern on a resist at a 1:1 feature size ratio. Thus, imprint mask integrity must be maintained throughout the lithography process because any flaw or structural defect present on a patterned imprint mask can be indelibly transferred to underlying layers during imprinting of a photoresist. One example of an undesirable structural defect is line-edge roughness (LER). LER refers to variations on sidewalls of features, which can result in variations of LER in the patterned photoresist and increased critical dimensions (CDs). Many factors can contribute to LER in the an imprint mask pattern, such as LER on chrome patterns residing on the reticle, image contrast in a system that generates the mask pattern, an etch process that can be used to pattern the mask, inherent properties and/or weaknesses of the mask materials, and/or the mask processing method. Additionally, LER appearing in fabricated structures can result from damage to the patterned resist during an etch process.

Current methods of pattern line formation on an imprint mask typically produce LER as an undesirable side effect. As lithographic techniques are pushed to their limits, smaller and smaller CDs are desired to maximize chip performance. Thus, chip manufacture is governed largely by wafer CD, which is defined as the smallest allowable width of, or space between, lines of circuitry in a semiconductor device. As methods of wafer manufacture are improved, wafer CD is decreased, which in turn requires finer and finer line edges to be produced. Line edges having a roughness that was acceptable just a year ago can detrimentally affect an imprint mask exhibiting today's critical dimension standards, which in turn can cause chip performance to deteriorate. Furthermore, as CD decreases, LER becomes increasingly difficult to avoid.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides for systems and methods that facilitate improved critical dimension (CD) control and mitigate line-edge roughness (LER) on pattern lines formed on an imprint mask during mask manufacture. More specifically, the systems and methods of the invention can mitigate LER and reduce CD to a desired target tolerance in order to improve imprint mask performance.

According to an aspect of the invention, an imprint mask can be fabricated having larger-than-target CDs. By intentionally manufacturing a mask with CDs above a target tolerance, LER can be mitigated. According to this aspect, a non-lithographic shrink technique can be applied to the imprint mask to reduce CD to within the target tolerance. Additionally, application of the non-lithographic shrink technique will mitigate any LER that might be present despite the use of relatively large CDs during mask fabrication. In this manner, the present invention can provide improved CD control while minimizing LER episodes.

Another aspect of the present invention provides for techniques that can be employed to selectively mitigate LER on pattern lines on an imprint mask. For example, a monitoring component can determine whether LER exists on pattern lines on an imprint mask and/or whether CD is within a target tolerance. If it is determined that LER is present, a non-lithographic shrink technique can be performed on the pattern feature(s) to mitigate LER. If CD is determined to be within a target tolerance, the shrink technique can be employed utilizing a minimum functional temperature, at which undesirable topography is mitigated while target CD is retained. Additionally, if CD is determined to be above a target tolerance, a non-lithographic shrink technique can be employed in the absence of LER to reduce CD.

According to another aspect, the non-lithographic shrink technique can be a thermal flow technique, whereby a patterned mask resist is heated to a predetermined minimum temperature, such as, for example, the glass transition temperature of the resist, so that the resist begins to exhibit fluid properties and begins to flow. By causing the resist to just enter a liquid phase, LER is mitigated because the solid physical state of the mask resist is compromised. The temperature to which the resist is heated can be high enough to mitigate LER but low enough to avoid a decrease in CD. In this manner, the invention advantageously mitigates LER while maintaining CD within a desired tolerance.

According to another aspect, the invention can employ a Resolution Enhancement Lithography Assisted by Chemical Shrink (RELACS™) technique. For example, imprint mask features can be shrunk to facilitate achieving Deep UV and/or Extreme UV dimensions. According to yet another aspect of the invention, a Shrink Assist Film for Enhanced Resolution (SAFIER) technique can be employed to facilitate a controlled shrink of, for example, and imprint mask negative of a contact opening or a gate channel. This technique is capable of shrinking a feature down to about 50 nm.

To the accomplishment of the foregoing and related ends, certain illustrative aspects of the invention are described herein in connection with the following description and the annexed drawings. These aspects are indicative, however, of but a few of the various ways in which the principles of the invention can be employed and the present invention is intended to comprise all such aspects and their equivalents. Other advantages and novel features of the invention will become apparent from the following detailed description of the invention when considered in conjunction with the drawings.

DETAILED DESCRIPTION OF THE INVENTION

The present invention will now be described with reference to the drawings, wherein like reference numerals are used to refer to like elements throughout. The present invention will be described with reference to systems and methods for mitigating line-edge roughness (LER) during pattern line formation on an imprint mask while reducing critical dimension (CD) to within a target tolerance. It should be understood that the description of these exemplary aspects are merely illustrative and that they should not be taken in a limiting sense.

The term "component" refers to a computer-related entity, either hardware, a combination of hardware and software, software, or software in execution. For example, a component can be a process running on a processor, a processor, an object, an executable, a thread of execution, a program and a computer. By way of illustration, both an application running on a server and the server can be components. A component can reside in one physical location (e.g., in one computer) and/or can be distributed between two or more cooperating locations (e.g., parallel processing computer, computer network).

It is to be appreciated that various aspects of the present invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, and function link networks) can be employed.

Figure 1:
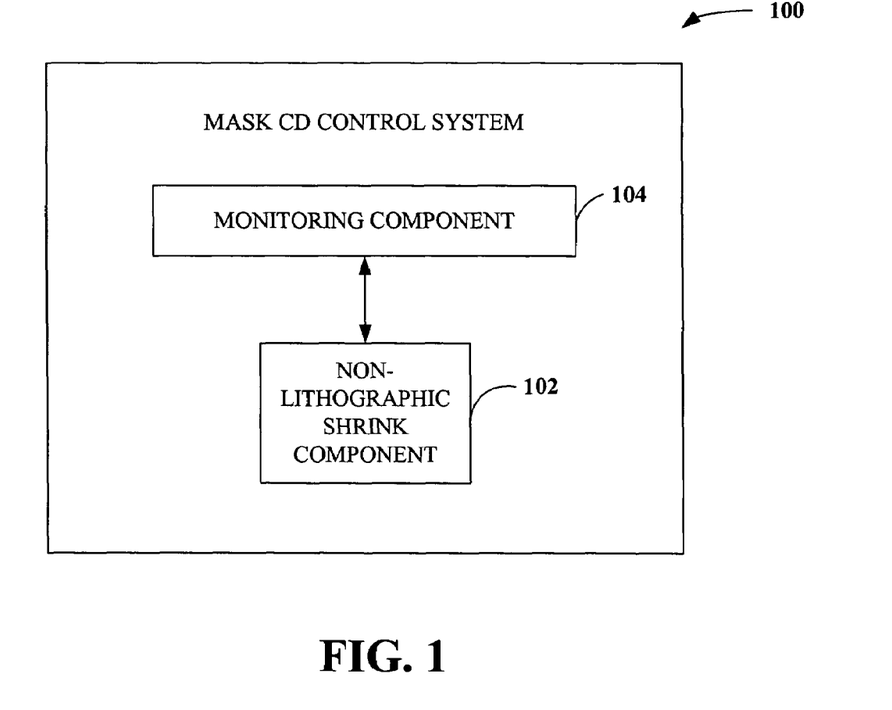
FIG. 1 is an illustration of a mask CD control system in accordance with an aspect of the present invention.

FIG. 1 is an illustration of an imprint mask CD control system 100 according to an aspect of the present invention. The mask CD control system 100 comprises a non-lithographic shrink component 102 that is operatively coupled to a monitoring component 104. According to this aspect of the invention, lines and/or features having a larger CD than is ultimately desired are formed in a mask resist via conventional methods. The monitoring component 104 can analyze and determine whether threshold LER exists on the pattern lines, and/or whether CD is within a target tolerance. The monitoring component 104 can employ scatterometry techniques to perform the preceding analysis.

Upon determining that a threshold amount of LER is present, the system 100 can mitigate any extant LER and reduce CD to within a target tolerance by employing the non-lithographic shrink component 102. According to an aspect of the invention, the non-lithographic shrink component 102 can be a thermal flow component that is capable of heating a resist (not shown) in which pattern lines have been formed to a temperature at which the resist will begin to flow. Such a temperature is often referred to as the "glass transition temperature" of a resist, which describes a temperature near the resist softening point and at which the resist begins to flow. By causing the resist to begin to flow, jagged edges associated with LER can be smoothed (e.g., mitigated). Additionally, the non-lithographic shrink component 102 can be a Resolution Enhancement Lithography Assisted by Chemical Shrink (RELACS™) component. For example, features can be manipulated to facilitate achieving Deep UV and/or Extreme UV dimensions. According to another example, the non-lithographic shrink component 102 can be a Shrink Assist Film for Enhanced Resolution (SAFIER) component that can facilitate a controlled shrink of, for example, a line or feature on a mask resist. Via employing a SAFIER technique, a SAFIER component can shrink a contact opening down to about 50 nm. Thus, the instant invention can advantageously mitigate LER associated with pattern line formation in a mask resist while reducing CD to within a desired tolerance.

It is to be appreciated that the monitoring component 104 can be, for example, a scatterometry component. The present invention contemplates any suitable scatterometry component and/or system, and such systems are intended to fall within the scope of the hereto-appended claims. It is further to be appreciated that the monitoring component 104 utilized by the present invention can be, for example, a Scanning Electron Microscope (SEM), a Critical Dimension Scanning Electron Microscope (CD-SEM), a Field Effect Scanning Electron Microscope (FESEM), an In-Lens FESEM, or a Semi-In-Lens FESEM, depending on the desired magnification and precision. For example, FESEM permits greater levels of magnification and resolution at high or low energy levels by rastering a narrower electron beam over the sample area. FESEM thus permits quality resolution at approximately 1.5 nm. Because FESEM can produce high-quality images at a wide range of accelerating voltages (typically 0.5 kV to 30 kV), it is able to do so without inducing extensive electrical charge in the sample. Furthermore, conventional SEM cannot accurately image an insulating material unless the material is first coated with an electrically conductive material. FESEM mitigates the need to deposit an electrically conductive coating prior to scanning. According to another example, the monitoring component 104 of the present invention can be In-Lens FESEM, which is capable of 0.5 nm resolution at an accelerating voltage of 30 kV, or any other suitable type of scanner, such as Transmission Electron Microscopy (TEM), Atomic Force Microscopy (AFM), Scanning Probe Microscopy (SPM), etc.

It is further to be appreciated that information gathered by the monitoring component 104 can be utilized for generating feedback and/or feed-forward data that can facilitate maintaining critical dimensions that are within acceptable tolerances. The mask CD control system 100 can additionally employ such data to control components and/or operating parameters associated therewith. For instance, feedback/feed-forward information can be generated from sequence analysis to maintain, increase and/or decrease a rate at which fabrication processes (e.g., thermal reflow, etching, . . . ) progress. Additionally, one or a plurality of sensors can be associated with the mask CD control system 100 to permit data to be gathered regarding the state of the mask (e.g., temperature, density, viscosity, material composition, and/or any other suitable information related to the condition of the mask).

Figure 2:
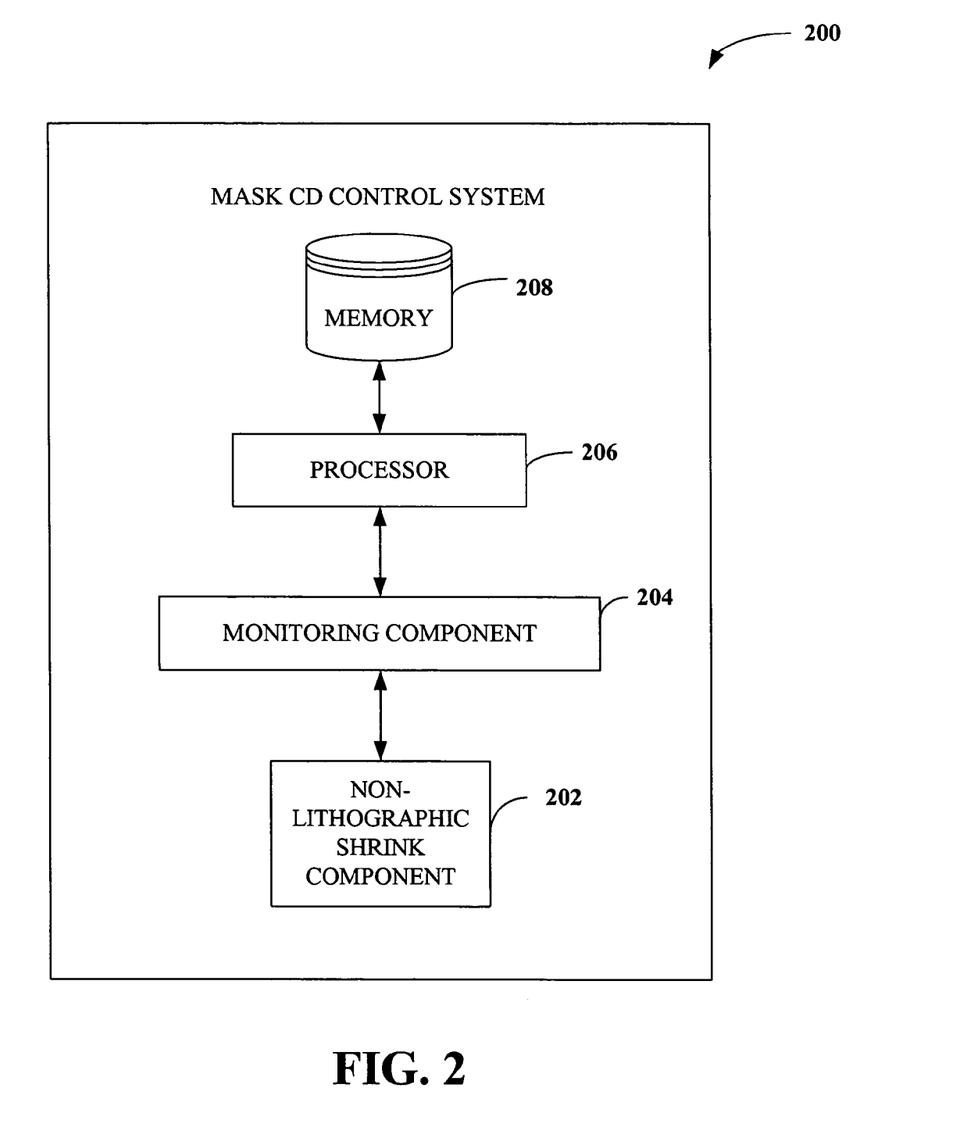
FIG. 2 is an illustration of a mask CD control system in accordance with an aspect of the present invention comprising a processor and a memory.

FIG. 2 illustrates a mask CD control system 200 in accordance with an aspect of the present invention. The mask CD control system 200 comprises a non-lithographic shrink component 202 that is operably coupled to a monitoring component 204. According to this aspect, the monitoring component 204 is further operably coupled to a processor 206, which is in turn operably coupled to a memory 208. It is to be understood that a that the processor 206 can be a processor dedicated to determining whether CD is within a desired target tolerance, whether LER exists, a processor used to control one or more of the components of the present system(s), or, alternatively, a processor that is used to determine whether CD is within a target tolerance, whether LER exists, and to control one or more of the components of the mask CD control system.

The memory component 208 can be employed to retain control programs, semiconductor fabrication data, etc. Furthermore, the memory 208 can be either volatile memory or nonvolatile memory, or can comprise both volatile and nonvolatile memory. By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 208 of the present systems and methods is intended to comprise, without being limited to, these and any other suitable types of memory.

Figure 3:
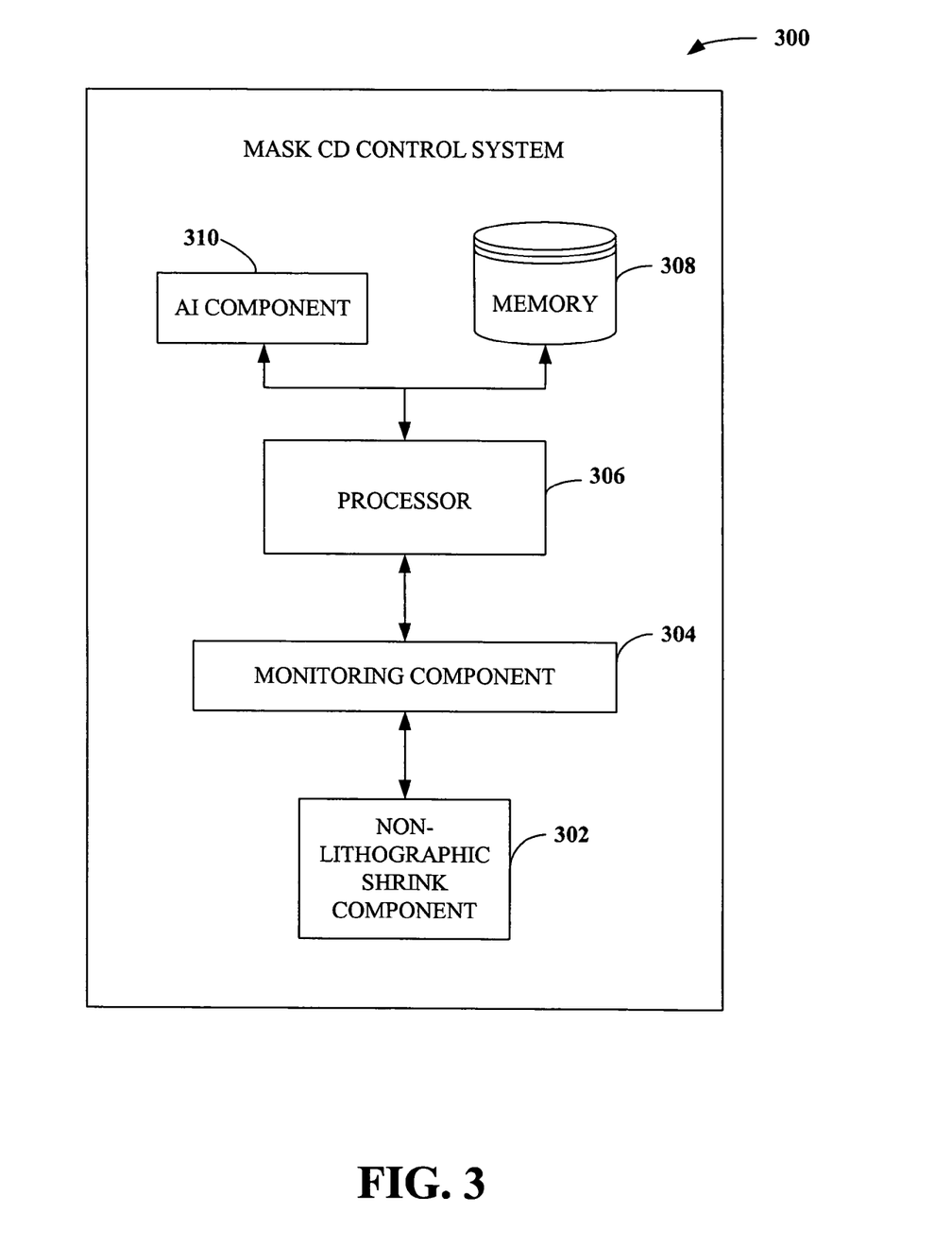
FIG. 3 is an illustration of a mask CD control system in accordance with the present invention wherein a processor comprises an artificial intelligence component.

FIG. 3 is an illustration of a mask CD control system 300 in accordance with an aspect of the present invention. The mask CD control system 300 can employ various inference schemes and/or techniques in connection with mitigating LER and/or reducing CD to within a target tolerance. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

Still referring to FIG. 3, the mask CD control system 300 comprises a non-lithographic shrink component 302 that is operably coupled to a monitoring component 304. A processor 306 is operably coupled to both a memory 308 and the monitoring component 304. According to this aspect of the invention, the processor 306 is further associated with an artificial intelligence (AI) component 310 that can make inferences regarding system operation. For example, the AI component 310 can determine an optimal duration for employing the non-lithographic shrink component 302. Additionally, the AI component can make inferences regarding an optimal temperature at which to expose the resist features to facilitate reducing CD while mitigating LER. According to another example, the AI component 310 can make inferences regarding whether target CD has been achieved. These examples are given by way of illustration only and are not in any way intended to limit the scope of the present invention or the number of, or manner in which the AI component makes, inferences.

Figure 4:
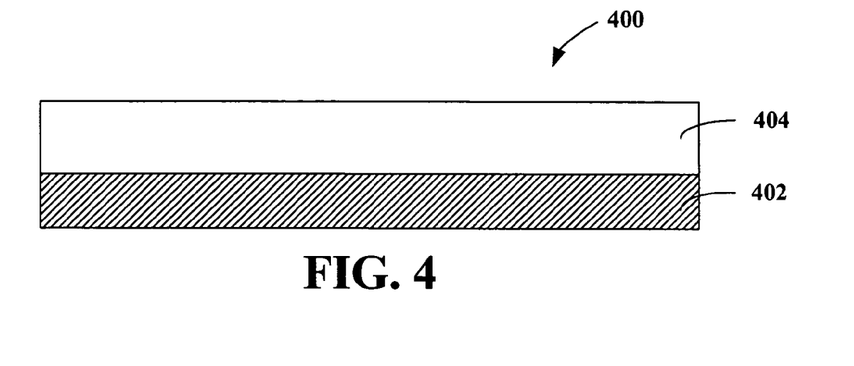
FIG. 4 is a cross-sectional illustration of a typical imprint mask substrate with an unpatterned resist overlay.

FIG. 4 is a cross-sectional illustration of an unpatterned mask 400. The mask 400 comprises a mask substrate 402 and a mask resist 404. The mask substrate can be, for example, fused silica, as is commonly used in the art. The mask resist 404 can be, for example, any suitable resist material into which desired patterns can be placed for imprinting into a wafer (e.g., poly(1-butene sulfone) (PBS), poly(glycidyl methacrylate) (PGMA), etc.). Such resist materials are given by way of example, and not limitation.

Figure 5:
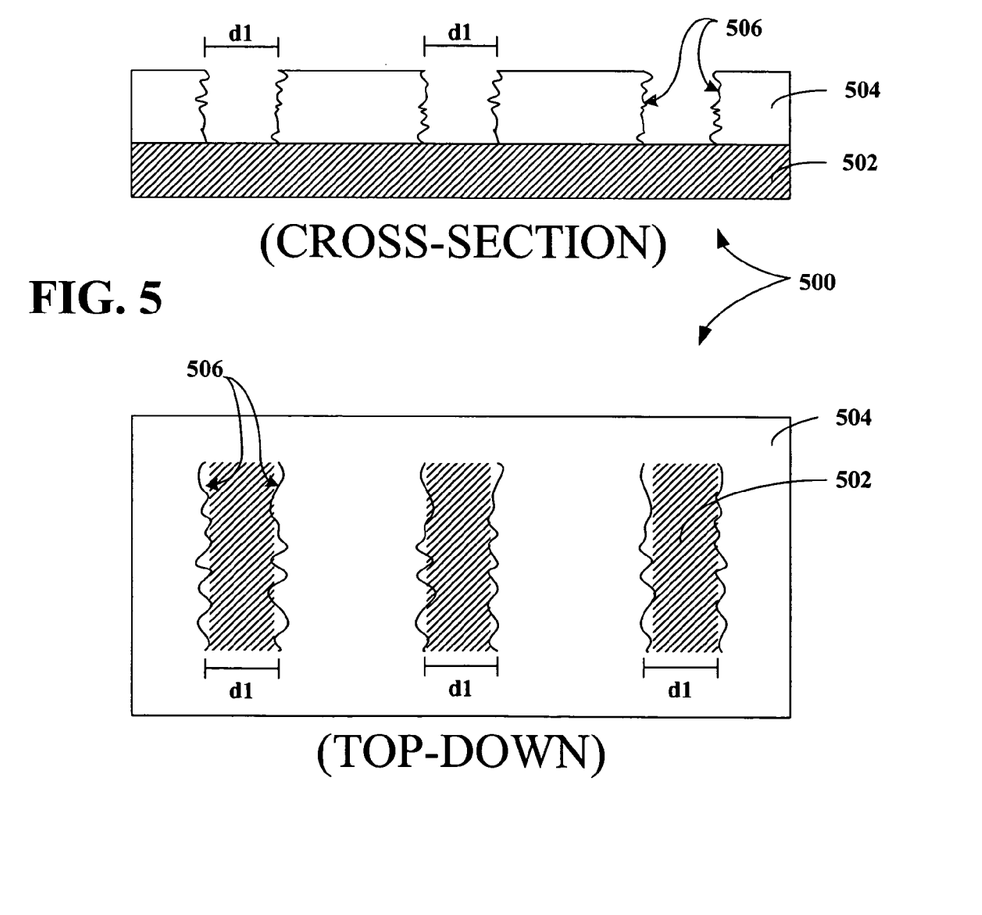
FIG. 5 illustrates a cross-sectional and top-down view of a mask with pattern lines exhibiting line-edge roughness (LER) and a CD, d1, greater than a desired target tolerance.

FIG. 5 illustrates cross-sectional and top down views of a mask 500 comprising a substrate 502 and a resist 504. Pattern lines have been formed in the mask resist 504, which exhibit LER 506 and have a CD, d1, which is greater than a desired target CD. CD, in this example, is defined as the width of a trench, rather than the width of the space between trenches. This definition of CD is offered merely for illustrative purposes, and it is to be understood that CD could alternatively be defined as the width of the space between trenches, in which scenario a shrink technique would increase CD to a target tolerance.

Figure 6:
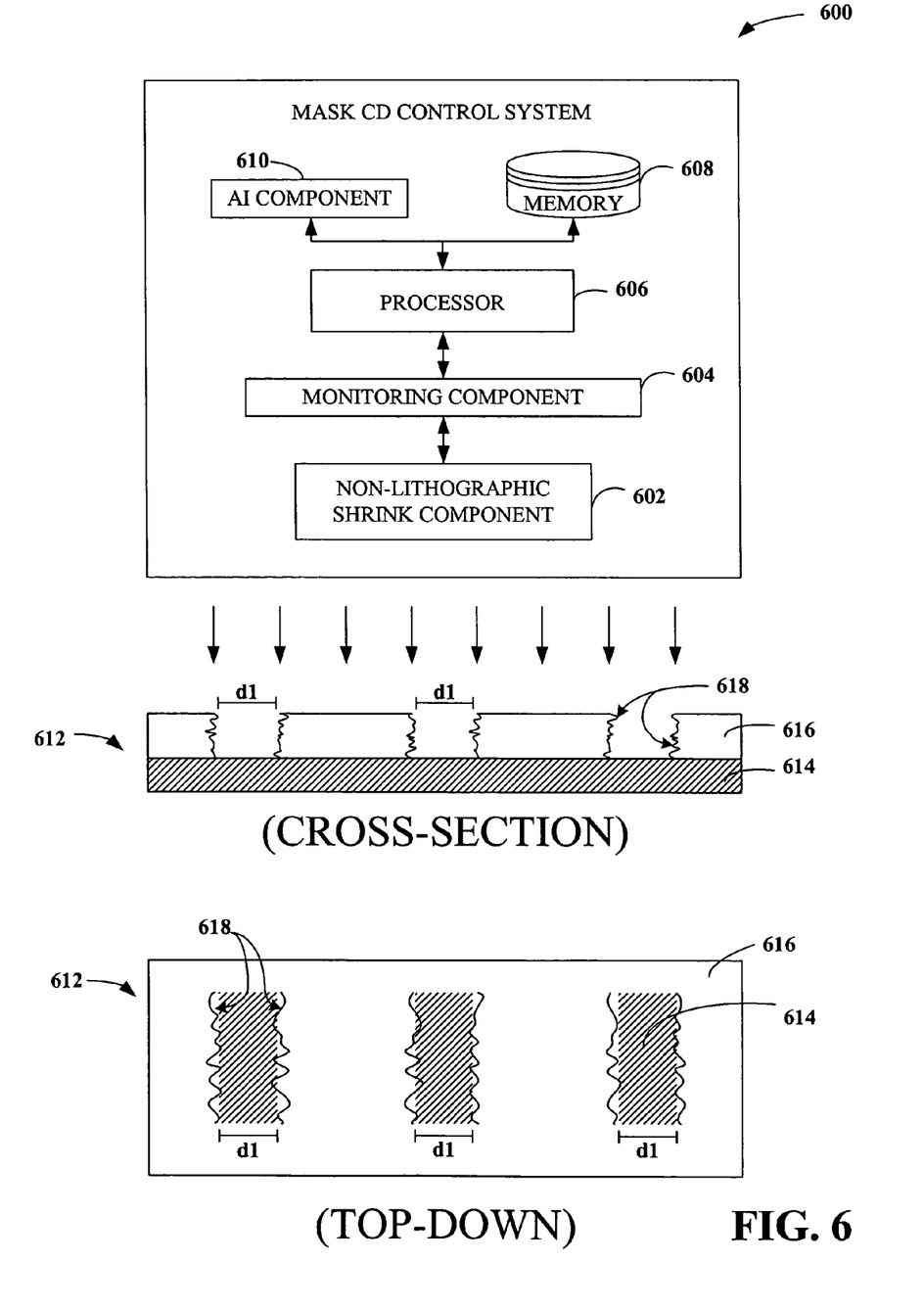
FIG. 6 is an illustration of a system in accordance with an aspect of the present invention wherein a non-lithographic shrink technique is applied to an imprint mask to mitigate LER and reduce CD to within a target tolerance.

FIG. 6 is an illustration of a mask 612 as described in FIG. 5 undergoing a non-lithographic shrink technique via a mask CD control system 600. This aspect of the invention contemplates thermal reflow techniques, SAFIER techniques, and/or RELACS™ techniques. However, the invention is not limited to the above-mentioned techniques, and can employ any suitable non-lithographic shrink technique. The mask CD control system 600 comprises a non-lithographic shrink technique component 602 operably coupled to a monitoring system 604. A processor 606 is operably coupled to a memory 608 and to the monitoring component 604. The processor 606 is associated with an AI component 610 that can make inferences regarding various aspects of CD control and/or LER mitigation.

Still referring to FIG. 6, mask CD control system 600 directs the shrink component 602 to perform a shrink technique on the mask 612. The performance of the technique is illustrated via solid arrows. The mask 612 comprises a mask substrate 614 (e.g., fused silica, etc.) and a resist layer 616 (e.g., PBS, PGMA, etc.), into which pattern lines exhibiting LER 618 have been formed. A distance d1 is shown, which is the CD measurement of the width of trenches formed in the resist. For purposes of this discussion, d1 represents a CD greater than the desired target CD. It should also be noted that line edge roughness as illustrated in FIG. 6 occurs in both the x-plane and the y-plane. Indeed, line edge roughness can occur in any plane, depending on the particular topography of a mask feature.

Figure 7:
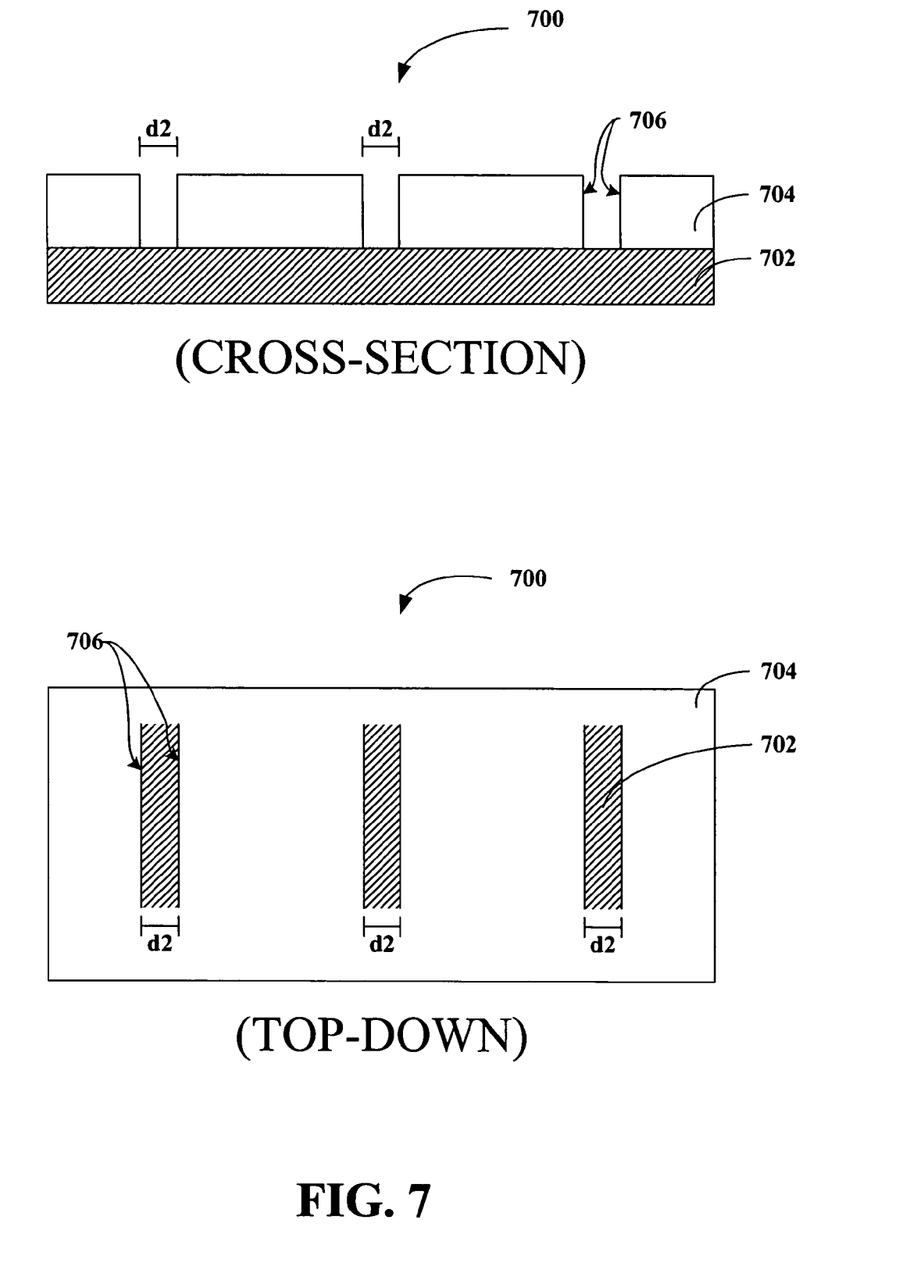
FIG. 7 illustrates cross-sectional and top-down views of an imprint mask

FIG. 7 illustrates a cross-sectional and top-down view of a mask 700 after the mask CD control system has performed a non-lithographic shrink technique. The mask 700 comprises a substrate 702 and a resist layer 704. According to this illustration, LER has been mitigated on pattern lines 706. It should be noted that the original CD defined by d1 has been reduced to the desired target CD, d2.

Figures 8, 9, 10:
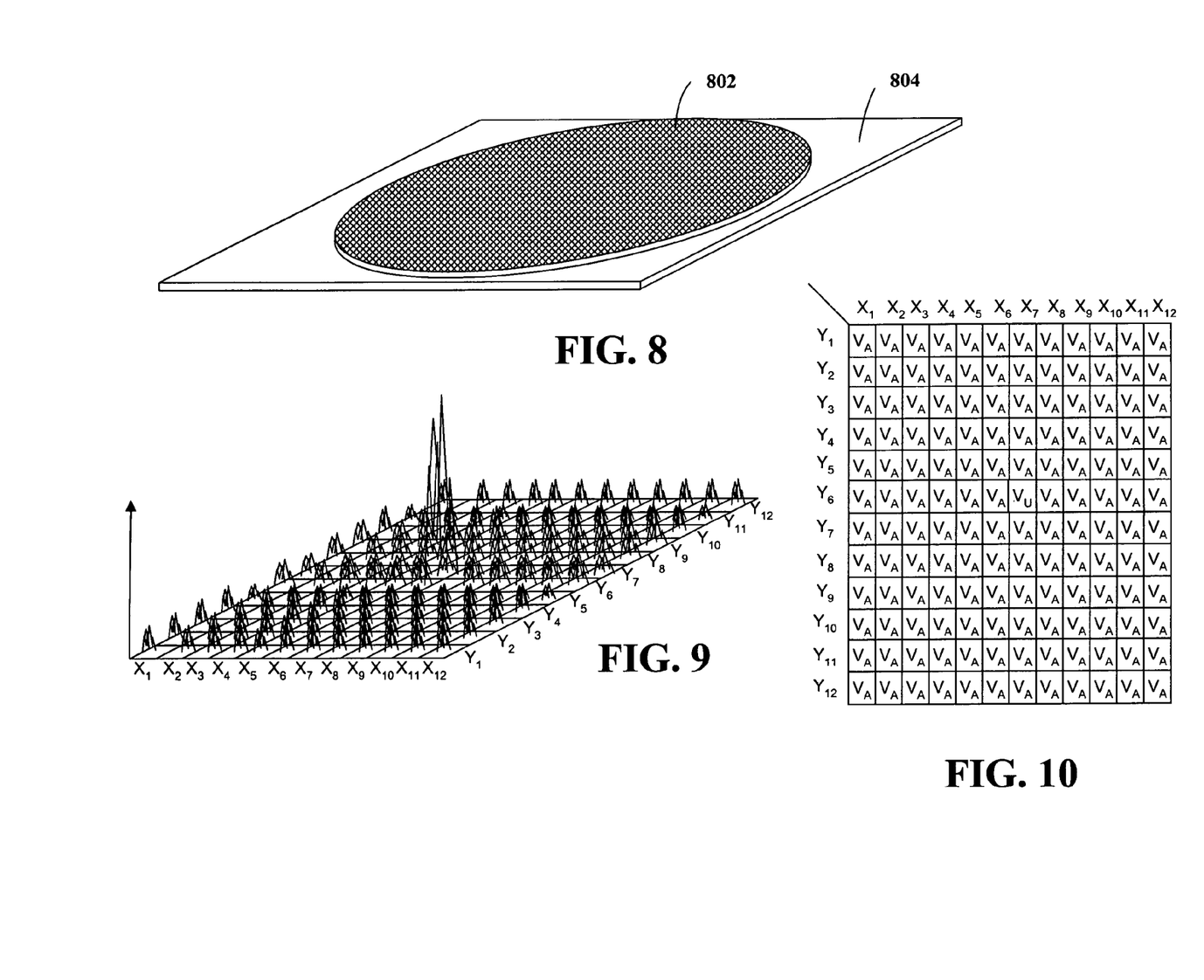
FIG. 8 illustrates a perspective view of a grid-mapped mask according to one or more aspects of the present invention.
FIG. 9 illustrates plots of measurements taken at grid-mapped locations on a mask in accordance with one or more aspects of the present invention.
FIG. 10 illustrates a table containing entries corresponding to measurements taken at respective grid-mapped locations on a mask in accordance with one or more aspects of the present invention.

Turning now to FIGS. 8–10, in accordance with one or more aspects of the present invention, a mask 802 (or one or more die located thereon) situated on a stage 804 can be logically partitioned into grid blocks to facilitate concurrent measurements of critical dimensions and overlay as the mask matriculates through a semiconductor fabrication process. This can facilitate selectively determining to what extent, if any, fabrication adjustments are necessary. Obtaining such information can also assist in determining problem areas associated with fabrication processes.

FIG. 8 illustrates a perspective view of the steppable stage 804 supporting the mask 802. The mask 802 can be divided into a grid pattern as shown in FIG. 8. Each grid block (XY) of the grid pattern corresponds to a particular portion of the mask 802 (e.g., a die or a portion of a die). The grid blocks are individually monitored for fabrication progress by concurrently measuring critical dimensions and overlay with either scatterometry or scanning electron microscope (SEM) techniques.

This can also be applicable in order to assess mask-to-mask and lot-to-lot variations. For example, a portion P (not shown) of a first mask (not shown) can be compared to the corresponding portion P (not shown) of a second mask. Thus, deviations between masks and lots can be determined in order to calculate adjustments to the fabrication components that are necessary to accommodate for the mask-to-mask and/or lot-to-lot variations.

In FIG. 9, one or more respective portions of the mask 802 ($X_1 Y_1 \ldots X_{12}, Y_{12}$) are concurrently monitored for critical dimensions and overlay utilizing either scatterometry or scanning electron microscope techniques. Exemplary measurements produced during fabrication for each grid block are illustrated as respective plots. The plots can, for example, be composite valuations of signatures of critical dimensions and overlay. Alternatively, critical dimensions and overlay values can be compared separately to their respective tolerance limits.

As can be seen, the measurement at coordinate $X_7 Y_6$ yields a plot that is substantially higher than the measurement of the other portions XY. This can be indicative of overlay, overlay error, and/or one or more critical dimension(s) outside of acceptable tolerances. As such, fabrication components and/or operating parameters associated therewith can be adjusted accordingly to mitigate repetition of this aberrational measurement. It is to be appreciated that the mask 802 and or one or more die located thereon can be mapped into any suitable number and/or arrangement of grid blocks to effectuate desired monitoring and control.

FIG. 10 is a representative table of concurrently measured critical dimensions and overlay taken at various portions of the mask 802 mapped to respective grid blocks. The measurements in the table can, for example, be amalgams of respective critical dimension and overlay signatures. As can be seen, all the grid blocks, except grid block $X_7 Y_6$, have measurement values corresponding to an acceptable value ($V_A$) (e.g., no overlay error is indicated and/or overlay measurements and critical dimensions are within acceptable tolerances), while grid block $X_7 Y_6$ has an undesired value ($V_u$) (e.g., overlay and critical dimensions are not within acceptable tolerances, thus at least an overlay or CD error exists). Thus, it has been determined that an undesirable fabrication condition exists at the portion of the mask 802 mapped by grid block $X_7 Y_6$. Accordingly, fabrication process components and parameters can be adjusted as described herein to adapt the fabrication process accordingly to mitigate the re-occurrence or exaggeration of this unacceptable condition.

Alternatively, a sufficient number of grid blocks can have desirable thickness measurements so that the single offensive grid block does not warrant scrapping the entire mask. It is to be appreciated that fabrication process parameters can be adapted so as to maintain, increase, decrease and/or qualitatively change the fabrication of the respective portions of the mask 802 as desired. For example, when the fabrication process has reached a pre-determined threshold level (e.g., X % of grid blocks have acceptable CDs and no overlay error exists), a fabrication step can be terminated.

Figure 11:
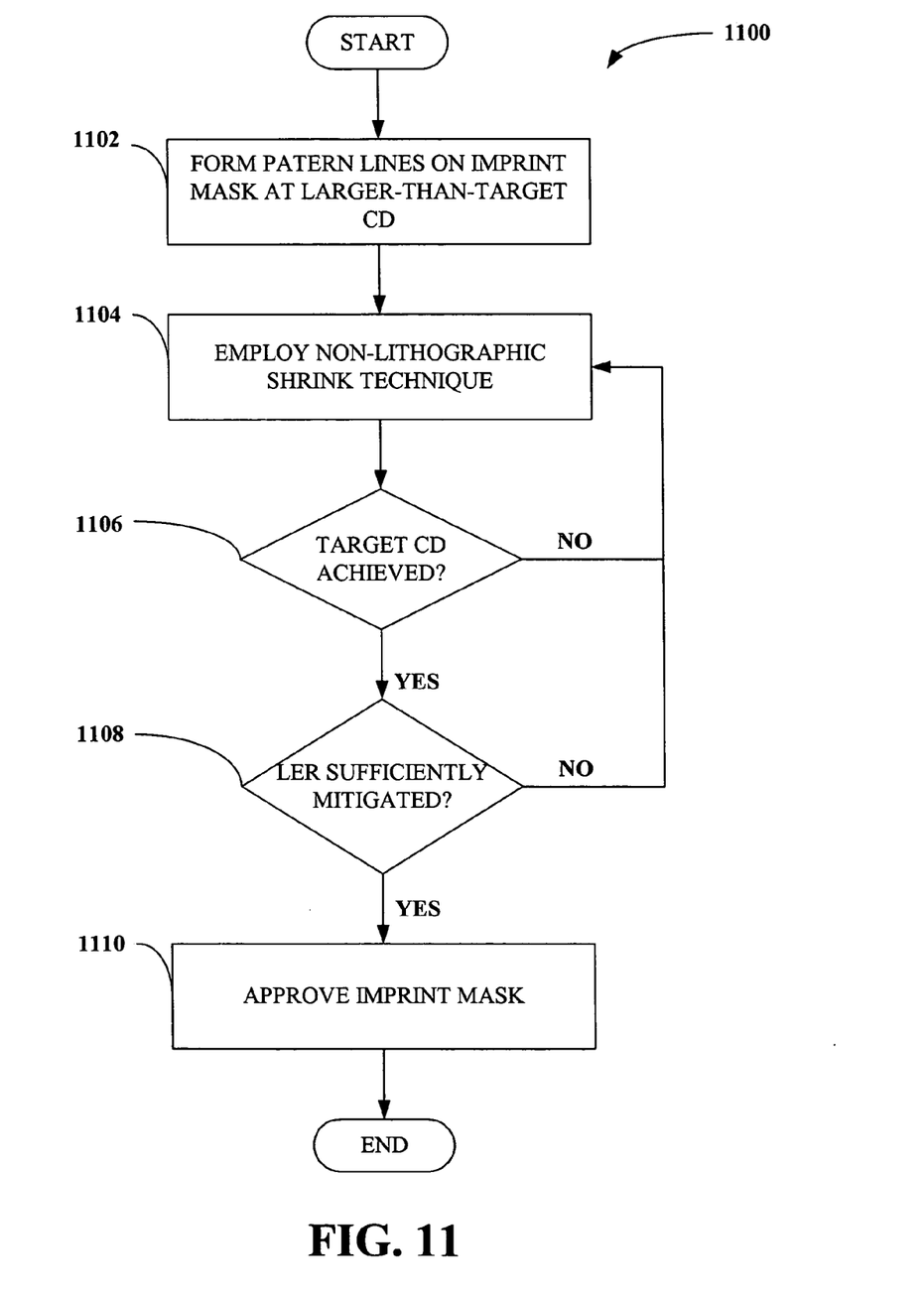
FIG. 11 is an illustration of a flow diagram of a methodology in accordance with an aspect of the present invention.
Figure 12:
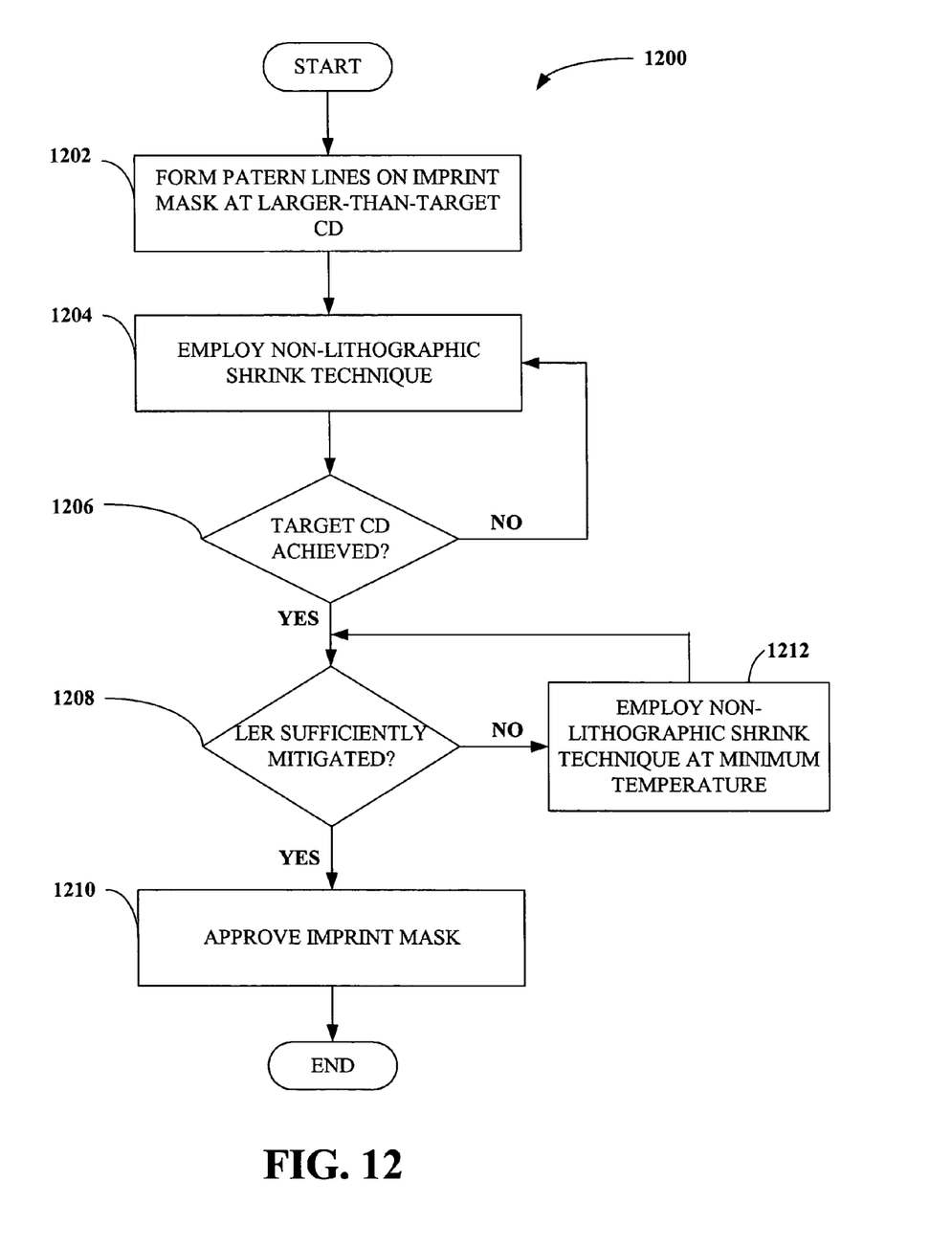
FIG. 12 is an illustration of a flow diagram of a methodology in accordance with an aspect of the present invention.
Figure 13:
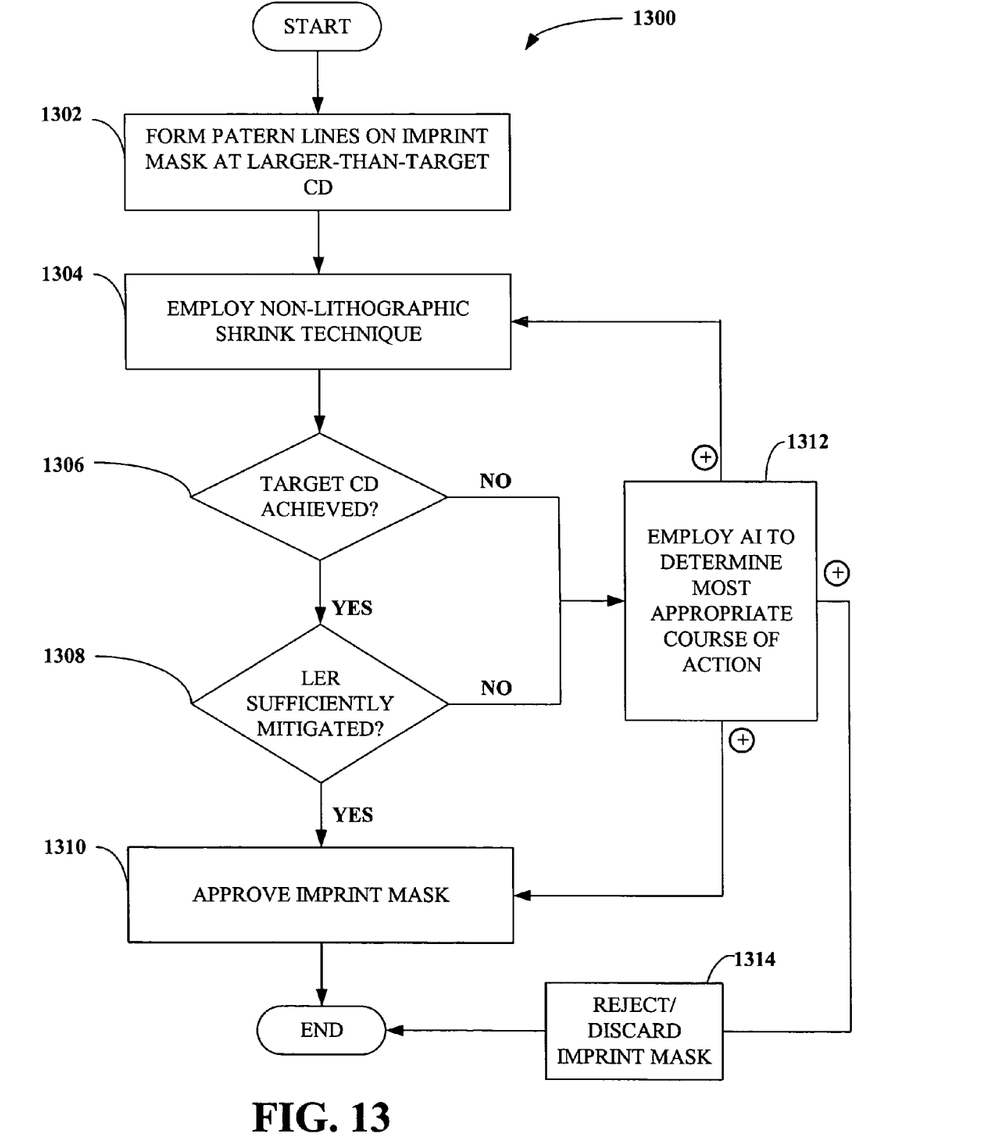
FIG. 13 is an illustration of a flow diagram of a methodology in accordance with an aspect of the present invention.

Now turning to FIGS. 11–13, methodologies that can be implemented in accordance with the present invention are illustrated. While, for purposes of simplicity of explanation, the methodologies are shown and described as a series of blocks, it is to be understood and appreciated that the present invention is not limited by the order of the blocks, as some blocks can, in accordance with the present invention, occur in different orders and/or concurrently with other blocks from that shown and described herein. Moreover, not all illustrated blocks may be required to implement the methodologies in accordance with the present invention.

FIG. 11 is an illustration of a methodology 1100 in accordance with an aspect of the present invention. At 1102, pattern lines are formed on an imprint mask at a larger-than-target CD, which permits formation of lines with less LER than would occur if the lines were formed at the smaller, target CD. At 1104, a non-lithographic shrink technique is applied to the imprint mask. According to one example, shrink material(s) can be applied to the resist via spin-coat technique(s). The non-lithographic shrink technique can be, for example, a thermal reflow technique, a Resolution Enhancement Lithography Assisted by Chemical Shrink (RELACS™) technique, and/or a Shrink Assist Film for Enhanced Resolution (SAFIER) technique. Typically, after a series of bakes and rinses, the features of the resist successfully will be shrunk. At 1106, a determination is made regarding whether the shrink was successful (e.g., the features and/or lines on the mask have been shrunk to within the desired target CD tolerance). Such determination can be made utilizing a monitoring component such as, for example, a scatterometry component, an SEM, etc., as has been described herein with regard to various other aspects of the invention. If CD is not within the desired tolerance, then the method can revert to 1104 for further shrinking. If the CD is within the target tolerance, then a determination is made at 1108 regarding the presence of any remaining LER. As stated above, LER is initially mitigated via fabrication of the mask at a larger-than-target CD. However, some LER may still occur at the larger CD, which can be mitigated by the application of the shrink technique. In the event that LER is still present at 1108, the method can revert to 1104, where the shrink technique can be reapplied to further reduce LER. Additionally, if LER is detected at 1108 but is determined to be acceptably minimal, the method can proceed to 1110, where the imprint mask is approved.

FIG. 12 is an illustration of a methodology 1200 in accordance with an aspect of the present invention. Utilizing conventional methods, features are formed in a resist layer on a mask at 1202. It is to be appreciated that the lines can delineate negatives of, for example, trenches, gates, or any other suitable structure that can be patterned onto or into a mask resist. The formation of lines conforms to a specific initial CD tolerance. At 1204, a non-lithographic shrink technique can be applied to reduce the CD of mask features. The non-lithographic shrink technique can be, for example, a thermal reflow technique, a Resolution Enhancement Lithography Assisted by Chemical Shrink (RELACS™) technique, and/or a Shrink Assist Film for Enhanced Resolution (SAFIER) technique. A determination is made at 1206 as to whether the new CD of the mask features is within a predetermined target tolerance. This determination can be made via employing, for example, a monitoring component such as a scanning electron microscope (SEM), a critical dimension SEM (CD-SEM), a scatterometry component, or any other suitable means for detecting, measuring, and/or monitoring CD and/or LER. If the new CD is not within the desired tolerance, the method can revert to 1204 to further reduce feature CD. If the new CD is within the desired tolerance, then a determination is made regarding the presence of any residual LER at 1208. If LER has been sufficiently mitigated, the method can proceed to 1210, where the mask is approved (e.g., for use, further fabrication, etc.). If it is determined at 1208 that an unacceptable amount of LER still exists on the resist features, then the method can proceed to 1212

At 1212, a non-lithographic shrink technique can be applied at a minimum temperature. By applying the non-lithographic shrink technique at a minimum effective temperature, any further decrease in CD can be avoided during the shrink technique, while LER can be further mitigated. For example, the temperature to which the resist is heated can be high enough to reduce LER, but low enough to preclude any decrease in CD. Such temperature is commonly referred to as the glass transition temperature of a resist. Additionally, duration of exposure to the minimum reaction temperature can be accounted for in order to ensure that CD remains within a target tolerance. In this manner, the present invention can reduce minimize the detrimental effects of the presence of LER on mask structure(s) while retaining a desired CD, in the event that no further CD reduction is desired.

FIG. 13 illustrates a methodology 1300 in accordance with an aspect of the invention wherein artificial intelligence (AI) is employed to facilitate CD control and/or LER mitigation during imprint mask fabrication. At 1302, features are formed in a mask resist at larger-than-target CDs. At 1304, a non-lithographic shrink technique is employed to reduce CD to a desired tolerance, while mitigating any LER that may have occurred during formation of the features at the larger CD. The non-lithographic shrink technique can be, for example, a thermal reflow technique, a Resolution Enhancement Lithography Assisted by Chemical Shrink (RELACS™) technique, and/or a Shrink Assist Film for Enhanced Resolution (SAFIER) technique. According to one example, AI techniques can be employed to determine a most suitable shrink technique, duration of the shrink technique, temperature at which the shrink technique is applied, etc. At 1306, a determination is made as to whether the original CD has been successfully reduced to the desired target CD. At 1308, a determination is made as to whether LER has been sufficiently mitigated (e.g., LER is completely absent, or present, but having a magnitude below a detrimental threshold level). The determinations at 1306 and/or 1308 can be facilitated via employing, for example, a monitoring component such as a scanning electron microscope (SEM), a critical dimension SEM (CD-SEM), a scatterometry component, or any other suitable means for detecting, measuring, and/or monitoring CD and/or LER expression. If both determinations are positive (e.g., target CD has been achieved and LER has been sufficiently mitigated), then the method can proceed to 1310, where the mask is approved. If either or both of the determinations at 1306 and 1308 are negative (e.g., either CD has not been reduced to target or LER is present in an amount above an acceptable threshold, or both), then the method can proceed to 1312, where AI techniques can be employed to determine a most appropriate course of action. Such potentially appropriate courses of action are given by way of example in FIG. 13, and are denoted by "exclusive 'or'" symbols. However, such courses of action are exemplary in nature, and other appropriate courses of action are intended to be within the scope of the present invention.

For example, inferences made by an AI component can determine that further application of a non-lithographic shrink technique can successfully reduce an unacceptable CD to within a desired target CD tolerance. If so, then the method can proceed from 1312 to 1304 for further shrink technique application. According to another example, if an unacceptable amount of LER has been detected at 1308, then reversion to 1304 for further shrink technique application can be inferred to be a most appropriate course of action at 1312. Additionally, if an unacceptable LER presence is detected at 1308 but the determination at 1306 indicates that target CD has been achieved, then an inference can be made that further non-lithographic shrink technique application is desirable at a minimum effective temperature (e.g., the glass transition temperature of the resist), so that LER can be further mitigated while target CD is retained.

According to a related example, inferences made at 1312 can indicate that approval of the mask is an appropriate course of action, in which case the method proceeds to 1310. In this example, approval of the mask despite a non-target CD or an undesirable amount of LER can be based at least in part on information indicating, for example, that the detected LER presence is in a non-crucial region of the mask, that the post-shrink CD is within a predetermined sub-tolerance of the desired CD target tolerance, etc.

Additionally, a most appropriate course of action can be simply to reject the mask altogether. For example, if the new CD of mask feature(s) is substantially below a target tolerance, then correction can be cost-prohibitive. In such a case, rejection and discarding of the mask can be a most appropriate course of action, and the method can proceed to 1314 in order to avoid any further production costs associated with fabrication of a particular mask.

Figure 14:
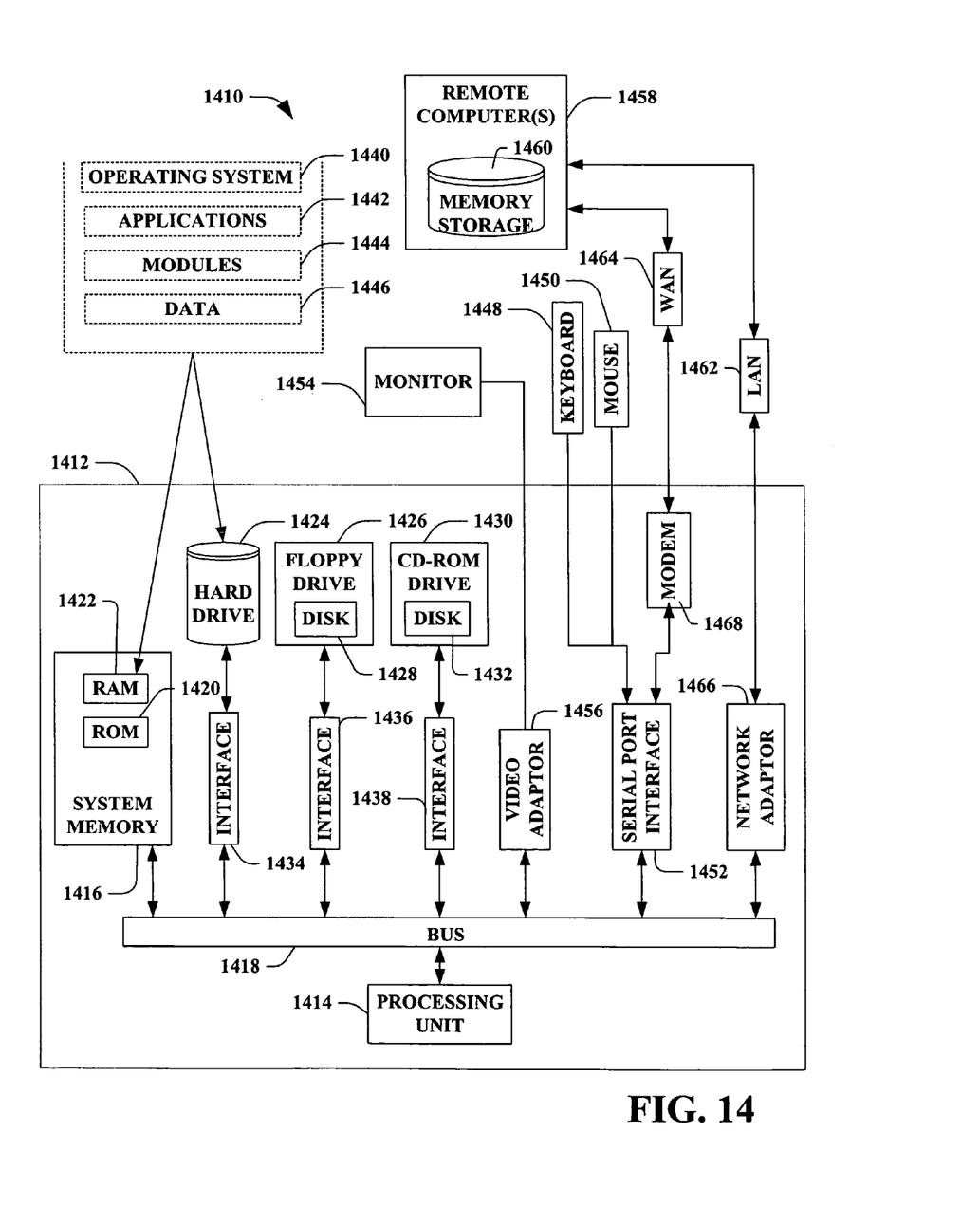
FIGS. 14 and 15 are illustrations of exemplary computing systems and/or environments in connection with facilitating employment of the subject invention.
Figure 15:
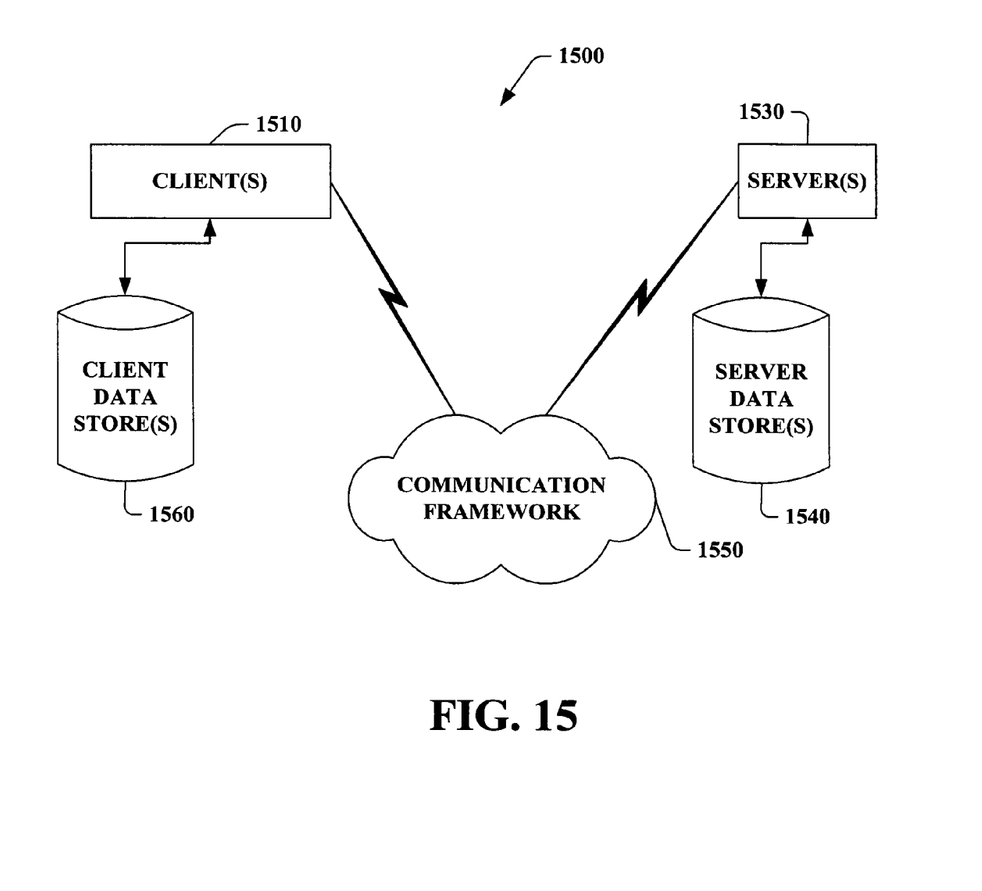

In order to provide a context for the various aspects of the invention, FIGS. 14 and 15 as well as the following discussion are intended to provide a brief, general description of a suitable computing environment in which the various aspects of the present invention can be implemented. While the invention has been described above in the general context of computer-executable instructions of a computer program that runs on a computer and/or computers, those skilled in the art will recognize that the invention also can be implemented in combination with other program modules. Generally, program modules include routines, programs, components, data structures, etc. that perform particular tasks and/or implement particular abstract data types. Moreover, those skilled in the art will appreciate that the inventive methods can be practiced with other computer system configurations, including single-processor or multiprocessor computer systems, mini-computing devices, mainframe computers, as well as personal computers, hand-held computing devices, microprocessor-based or programmable consumer electronics, and the like. The illustrated aspects of the invention can also be practiced in distributed computing environments where tasks are performed by remote processing devices that are linked through a communications network. However, some, if not all, aspects of the invention can be practiced on stand-alone computers. In a distributed computing environment, program modules can be located in both local and remote memory storage devices.

With reference to FIG. 14, an exemplary environment 1410 for implementing various aspects of the invention includes a computer 1412. The computer 1412 includes a processing unit 1414, a system memory 1416, and a system bus 1418. The system bus 1418 couples system components including, but not limited to, the system memory 1416 to the processing unit 1414. The processing unit 1414 can be any of various available processors. Dual microprocessors and other multiprocessor architectures also can be employed as the processing unit 1414.

The system bus 1418 can be any of several types of bus structure(s) including the memory bus or memory controller, a peripheral bus or external bus, and/or a local bus utilizing any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1416 includes volatile memory 1420 and nonvolatile memory 1422. The basic input/output system (BIOS), comprising the basic routines to transfer information between elements within the computer 1412, such as during start-up, is stored in nonvolatile memory 1422. By way of illustration, and not limitation, nonvolatile memory 1422 can include read only memory (ROM), programmable ROM (PROM), electrically programmable ROM (EPROM), electrically erasable ROM (EEPROM), or flash memory. Volatile memory 1420 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1412 also includes removable/non-removable, volatile/non-volatile computer storage media. FIG. 14 illustrates, for example, a disk storage 1424. Disk storage 1424 includes, but is not limited to, devices like a magnetic disk drive, floppy disk drive, tape drive, Jaz drive, Zip drive, LS-100 drive, flash memory card, or memory stick. In addition, disk storage 1424 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1424 to the system bus 1418, a removable or non-removable interface is typically used such as interface 1426.

It is to be appreciated that FIG. 14 describes software that acts as an intermediary between users and the basic computer resources described in suitable operating environment 1410. Such software includes an operating system 1428. Operating system 1428, which can be stored on disk storage 1424, acts to control and allocate resources of the computer system 1412. System applications 1430 take advantage of the management of resources by operating system 1428 through program modules 1432 and program data 1434 stored either in system memory 1416 or on disk storage 1424. It is to be appreciated that the present invention can be implemented with various operating systems or combinations of operating systems.

A user enters commands or information into the computer 1412 through input device(s) 1436. Input devices 1436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1414 through the system bus 1418 via interface port(s) 1438. Interface port(s) 1438 include, for example, a serial port, a parallel port, a game port, and a universal serial bus (USB). Output device(s) 1440 use some of the same type of ports as input device(s) 1436. Thus, for example, a USB port can be used to provide input to computer 1412, and to output information from computer 1412 to an output device 1440. Output adapter 1442 is provided to illustrate that there are some output devices 1440 like monitors, speakers, and printers, among other output devices 1440, which require special adapters. The output adapters 1442 include, by way of illustration and not limitation, video and sound cards that provide a means of connection between the output device 1440 and the system bus 1418. It should be noted that other devices and/or systems of devices provide both input and output capabilities such as remote computer(s) 1444.

Computer 1412 can operate in a networked environment utilizing logical connections to one or more remote computers, such as remote computer(s) 1444. The remote computer(s) 1444 can be a personal computer, a server, a router, a network PC, a workstation, a microprocessor based appliance, a peer device or other common network node and the like, and typically includes many or all of the elements described relative to computer 1412. For purposes of brevity, only a memory storage device 1446 is illustrated with remote computer(s) 1444. Remote computer(s) 1444 is logically connected to computer 1412 through a network interface 1448 and then physically connected via communication connection 1450. Network interface 1448 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1450 refers to the hardware/software employed to connect the network interface 1448 to the bus 1418. While communication connection 1450 is shown for illustrative clarity inside computer 1412, it can also be external to computer 1412. The hardware/software necessary for connection to the network interface 1448 includes, for exemplary purposes only, internal and external technologies such as, modems including regular telephone grade modems, cable modems and DSL modems, ISDN adapters, and Ethernet cards.

FIG. 15 is a schematic block diagram of a sample-computing environment 1500 with which the present invention can interact. The system 1500 includes one or more client(s) 1510. The client(s) 1510 can be hardware and/or software (e.g., threads, processes, computing devices). The system 1500 also includes one or more server(s) 1530. The server(s) 1530 can also be hardware and/or software (e.g., threads, processes, computing devices). The servers 1530 can house threads to perform transformations by employing the present invention, for example. One possible communication between a client 1510 and a server 1530 can be in the form of a data packet adapted to be transmitted between two or more computer processes. The system 1500 includes a communication framework 1550 that can be employed to facilitate communications between the client(s) 1510 and the server(s) 1530. The client(s) 1510 are operably connected to one or more client data store(s) 1560 that can be employed to store information local to the client(s) 1510. Similarly, the server(s) 1530 are operably connected to one or more server data store(s) 1540 that can be employed to store information local to the servers 1530.

What has been described above comprises examples of the present invention. It is, of course, not possible to describe every conceivable combination of components or methodologies for purposes of describing the present invention, but one of ordinary skill in the art can recognize that many further combinations and permutations of the present invention are possible. Accordingly, the present invention is intended to embrace all such alterations, modifications and variations that fall within the spirit and scope of the appended claims. Furthermore, to the extent that the term "comprises" is used in either the detailed description or the claims, such term is intended to be inclusive in a manner similar to the term "comprising" as "comprising" is interpreted when employed as a transitional word in a claim.

What is claimed is:

1. A system that improves critical dimension control and mitigates line edge roughness in imprint mask manufacture, comprising:
   a non-lithographic shrink component that reduces critical dimension(s) and/or mitigates line edge roughness on mask feature(s) at least by performing a non-lithographic shrink technique on the mask feature(s);
   a monitoring component that measures critical dimension and line edge roughness on a mask during fabrication; and
   a processor that analyzes data associated with at least one of critical dimension, line edge roughness, and non-lithographic shrink technique(s).

2. The system of claim 1, the monitoring component comprises at least one of a scatterometry system, and a Scanning Electron Microscopy system.

3. The system of claim 1, the processor comprises an artificial intelligence component that makes inferences regarding at least one of reducing mask critical dimension(s) to a target critical dimension and mitigating line edge roughness.

4. The system of claim 3, the artificial intelligence component comprises at least one of a support vector machine, a neural network, an expert system, a Bayesian belief network, fuzzy logic, and a data fusion engine.

5. The system of claim 1, the non-lithographic shrink component comprises at least one of a Resolution Enhancement Lithography Assisted by Chemical Shrink (RELACS™) component, a Shrink Assist Film for Enhanced Resolution (SAFIER) component, and a thermal reflow component.

6. The system of claim 1, further comprising at least one sensor that gathers data associated with at least one parameter of a physical condition of the mask.

* * * * *